(12) United States Patent
Morimura et al.

(10) Patent No.: US 7,019,563 B2
(45) Date of Patent: Mar. 28, 2006

(54) WAVEFORM SHAPING CIRCUIT

(75) Inventors: Hiroki Morimura, Kanagawa (JP);
Toshishige Shimamura, Kanagawa (JP); Koji Fujii, Kanagawa (JP);
Satoshi Shigematsu, Kanagawa (JP);
Yukio Okazaki, Kanagawa (JP);
Katsuyuki Machida, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/505,629

(22) PCT Filed: Jan. 21, 2004

(86) PCT No.: PCT/JP2004/000506

§ 371 (c)(1),
(2), (4) Date: Aug. 19, 2004

(87) PCT Pub. No.: WO2004/066500

PCT Pub. Date: Aug. 5, 2004

(65) Prior Publication Data

US 2005/0258877 A1    Nov. 24, 2005

(30) Foreign Application Priority Data

Jan. 23, 2003    (JP) .............................. 2003-014834

(51) Int. Cl.
*H03B 1/00*    (2006.01)

(52) U.S. Cl. ...................... 327/112; 327/437

(58) Field of Classification Search ................ 327/108, 327/112, 376–377, 437
See application file for complete search history.

(56) References Cited

U.S. PATENT DOCUMENTS 6,646,469 B1 * 11/2003 Yushan ........................ 326/83
6,674,318 B1 *  1/2004 Kanda et al. ................ 327/540

FOREIGN PATENT DOCUMENTS

| JP | 09-083345 A | 3/1997 |
| JP | 09-116422 A | 5/1997 |
| JP | 3482141 B  | 12/2000 |

OTHER PUBLICATIONS

Weste et al., "Principles of CMOS VLSI Design -A systems Perspective-", the $2^{nd}$ ed., Addison-Wesley Publishing Company, 1994, p. 367.

* cited by examiner

*Primary Examiner*—My-Trang Nu Ton
(74) *Attorney, Agent, or Firm*—Blakely Sokoloff Taylor & Zafman

(57) ABSTRACT

A first control potential setting means (1) generates a first control potential (N2) which reverses the magnitude relationship with a second control potential (N3) when an input signal (IN) reaches the vicinity of a logical threshold value. A second control potential setting means (2) generates the second control potential (N3) which changes in the same direction as the input signal (IN), in accordance with a change in input signal (IN). An output means (3) includes transistors (Q5, Q6), and generates an output signal (OUT) having a predetermined potential on the basis of the first control potential (N2), the second control potential (N3), and a reset signal (RSET). A reset means (4) turns off the transistor (Q6) while a waveform shaping circuit is in operation.

32 Claims, 11 Drawing Sheets

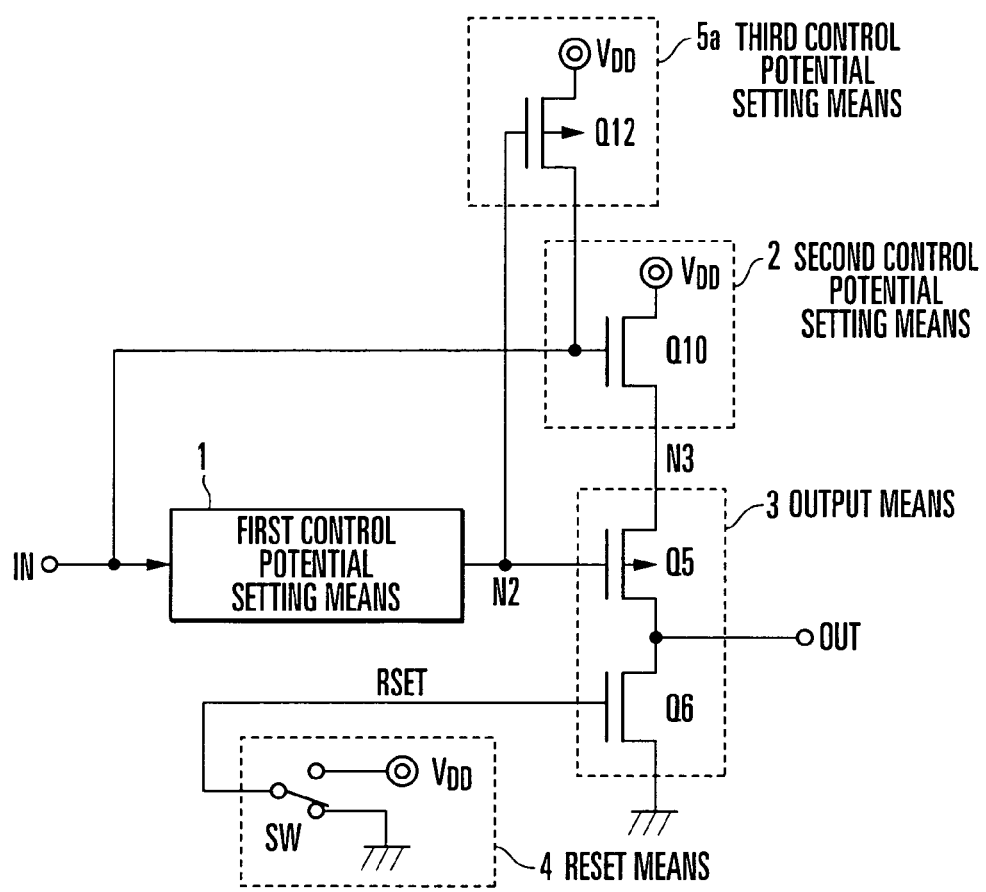
F I G. 16

WAVEFORM SHAPING CIRCUIT

The present patent application is a non-provisional application of International Application No. PCT/JP2004/000506, filed Jan. 21, 2004.

TECHNICAL FIELD

The present invention relates to a waveform shaping circuit which outputs a digital signal by shaping the waveform of a digital input signal or analog input signal having a slope.

BACKGROUND ART

FIG. 17A shows an arrangement using a Schmitt trigger circuit, as an example of implementation of a conventional waveform shaping circuit. To simplify the explanation, this waveform shaping circuit shows a circuit configuration designed by taking account of a case in which an input signal IN changes from Low (a ground potential GND) to High (a power supply potential $V_{DD}$). As shown in the block diagram of FIG. 17A, this conventional waveform shaping circuit comprises a control potential setting means 11 for generating a control potential on the basis of the input signal IN, and an output means 13 for outputting an output signal OUT on the basis of the output control potential from the control potential setting means 11.

FIG. 17B shows a practical circuit example. In FIG. 17B, reference symbols Q1 and Q15 denote P-channel MOS transistors; Q2, Q3, Q4, and Q16, N-channel MOS transistors; and $V_{DD}$, the power supply potential. The control potential setting means 11 is made up of the transistors Q1, Q2, Q3, and Q4, and the output means 13 is made up of the transistors Q15 and Q16. These elements construct the waveform shaping circuit. This waveform shaping circuit outputs a signal having the same polarity as the input signal IN. If one inverter is added in series with the output means 13, the waveform shaping circuit outputs an inverted signal of the input signal IN.

FIG. 18A is a voltage waveform chart showing the operation of the waveform shaping circuit shown in FIG. 17B. Assuming that the input signal IN gradually changes from Low to High, the output signal changes to High when the input signal IN exceeds a logical threshold value Vth. When the input signal IN exceeds the logical threshold value Vth, the gate potential (the potential of N1 in FIG. 17B) of the transistor Q4 lowers, so the transistor Q4 is cut off. Consequently, the logical threshold value Vth of the waveform shaping circuit slightly lowers, so High can be stably output as the output potential even if the input signal IN fluctuates by the influence of external noise or the like.

That is, the waveform shaping circuit shown in FIG. 17B has a function of stably shaping the waveform of the input signal IN into a Low or High digital signal on the basis of the logical threshold value Vth as a boundary. When the input signal IN changes from High to Low, the same effect can be obtained by using an arrangement (called a second arrangement) in which the power supply voltage $V_{DD}$ and ground GND are switched by switching the polarities of the MOS transistors in the arrangement (called a first arrangement) shown in FIG. 17B. Since the input signal IN generally changes from Low to High and from High to Low, a circuit configuration obtained by combining the first arrangement and second arrangement is used in practice (e.g., reference [Neil H. E. Weste and another, "PRINCIPLES OF CMOS VLSI DESIGN—A Systems Perspective—", the 2nd ed., Addison-Wesley Publishing Company, 1994, p. 367]).

As shown in FIG. 18B, however, the conventional waveform shaping circuit has the problem that a large through current (sink current) Itotal flows from the power supply potential $V_{DD}$ to the ground GND if the input signal IN is close to the logical threshold value Vth. The paths of the through current Itotal are: paths in which the current flows from the power supply potential $V_{DD}$ to the ground GND via the transistors Q1, Q2, and Q3, and via the transistors Q4 and Q3, since the transistors Q1, Q2, Q3, and Q4 are weakly turned on when the input signal IN is close to the logical threshold value Vth; and a path in which the current flows from the power supply potential $V_{DD}$ to the ground GND via the transistors Q15 and Q16, since the transistors Q15 and Q16 are weakly turned on when the gate potential N1 of the transistor Q4 is close to the logical threshold value Vth. As shown in FIG. 17B, letting I1 be a through current flowing through the transistors Q15 and Q16 and I2 be a through current flowing through the transistor Q3, Itotal=I1+I2.

The more moderate the change in input signal IN, the longer the time during which the through current Itotal flows. Therefore, in an application using a large number of waveform shaping circuits, the through current occupies a large portion of the current consumption of the overall circuit, so it is necessary to suppress the current consumption by preparing a power supply having a large current capacity, or by limiting the number of waveform shaping circuits.

As a conventional through current reducing method, Japanese Patent Laid-Open No. 9-83345 discloses a method which performs control by a clock signal or the like by connecting a switch transistor in series in the path of the through current. This method cuts off the series-connected switch transistor when the input is at an intermediate potential and the through current flows, and turns on the switch transistor when the input signal is determined and no through current flows.

Unfortunately, although the method disclosed in Japanese Patent Laid-Open No. 9-83345 can eliminate the through current, it cannot capture the moment at which the input signal exceeds the logical threshold value of the waveform shaping circuit. That is, the method cannot be used to detect the time at which an analog input signal having a slope exceeds the logical threshold value as disclosed in Japanese Patent No. 3082141.

Another through current reducing method is to reduce the through current by using a dynamic operation. In this dynamic operation, each node of the circuit is set at (charged or discharged to) a potential determined before the operation, and a switch transistor is cut off during the operation so that no through current flows. When an input signal turns on a transistor in the circuit, the charged electric charge is discharged (or the discharged electric charge is charged), and the output voltage changes. This makes it possible to reduce the through current, and at the same time capture the moment at which an input signal exceeds the logical threshold value of the waveform shaping circuit.

Unfortunately, the waveform shaping circuit which reduces the through current by the dynamic operation has the problem that the threshold value of the circuit is the threshold voltage (normally 0.4 to 0.6 V) of a transistor. It is usually appropriate to set the logical threshold value at about half the power supply potential (e.g., 1.6 to 1.7 V when the power supply voltage is 3.3 V), but this setting cannot be performed in the waveform shaping circuit using the dynamic operation. Accordingly, no conventional method capable of setting the normal threshold value while reducing the through current by the dynamic operation has been proposed.

DISCLOSURE OF INVENTION

It is an object of the present invention to provide a waveform shaping circuit capable of setting the logical threshold value at an appropriate value while reducing the through current during an operation by using the dynamic operation, in order to solve the above problem.

The present invention provides a waveform shaping circuit which, on the basis of a logical threshold value, discriminates a level and shapes a waveform of an input signal which changes between a first power supply potential and second power supply potential, comprising first control potential setting means for generating a first control potential, second control potential setting means for generating a second control potential which changes in the same direction as the input signal in accordance with a change in input signal, output means which comprises a first transistor of a first conductivity type having a gate terminal to which the first control potential is applied, and a source terminal to which the second control potential is applied, and a second transistor of a second conductivity type having a source terminal to which the first power supply potential is applied, and a drain terminal to which the drain terminal of the first transistor is connected, and which outputs an output signal having a potential of the drain terminals of the first and second transistors, and reset means for applying a reset signal for turning off the second transistor to the gate terminal of the second transistor, wherein the first control potential setting means generates the first control potential which reverses a magnitude relationship with the second control potential when the input signal reaches a vicinity of the logical threshold value, and the output means generates an output signal having a predetermined potential on the basis of the first control potential, second control potential, and reset signal.

In a configuration example of the waveform shaping circuit of the present invention, the first control potential setting means comprises a third transistor of the first conductivity type having a source terminal to which the second power supply potential is applied, and a drain terminal which is connected as an output of the first control potential setting means to the gate terminal of the first transistor, a fourth transistor of the second conductivity type having a gate terminal to which the input signal is input, and a drain terminal which is connected as an output of the first control potential setting means to the gate terminal of the first transistor, a fifth transistor of the second conductivity type having a gate terminal to which the reset signal is input, a source terminal to which the first power supply potential is applied, and a drain terminal which is connected to the source terminal of the fourth transistor, an inverter gate having an input terminal to which the reset signal is input, and an output terminal which is connected to the gate terminal of the third transistor, and a first capacitance element having a first terminal which is connected to the source terminal of the fourth transistor and the drain terminal of the fifth transistor, and a second terminal to which the third power supply potential is applied, and the reset means outputs the reset signal which turns on the third transistor and the fifth transistor before the waveform shaping circuit operates, and outputs the reset signal which turns off the third transistor and the fifth transistor while the waveform shaping circuit is in operation.

In a configuration example of the waveform shaping circuit of the present invention, the first control potential setting means further comprises a second capacitance element having a first terminal which is connected to the drain terminals of the third transistor and the fourth transistor, and a second terminal to which the fourth power supply potential is applied.

In a configuration example of the waveform shaping circuit of the present invention, the reset means outputs the reset signal such that the second transistor is turned off before the first transistor is turned on.

In a configuration example of the waveform shaping circuit of the present invention, the reset means outputs the reset signal such that the second transistor is turned off before the first transistor is turned on, and the third transistor and the fifth transistor are turned off before the fourth transistor is turned on.

In a configuration example of the waveform shaping circuit of the present invention, the second control potential setting means sets the second control potential at the same potential as the input signal.

In a configuration example of the waveform shaping circuit of the present invention, the second control potential setting means comprises a signal line which shortcircuits an input terminal of the waveform shaping circuit and the source terminal of the first transistor, and sets the second control potential at the same potential as the input signal.

In a configuration example of the waveform shaping circuit of the present invention, the second control potential setting means comprises a sixth transistor of the second conductivity type having a gate terminal to which the input signal is applied, a drain terminal to which the second power supply potential is applied, and a source terminal which is connected to the source terminal of the first transistor, and outputs a potential of the source terminal of the sixth transistor as the second control potential.

A configuration example of the waveform shaping circuit of the present invention further comprises third control potential setting means for compensating for the second control potential, when the input signal exceeds the logical threshold value, in accordance with the potential of the output signal.

In a configuration example of the waveform shaping circuit of the present invention, the third control potential setting means comprises a seventh transistor of the second conductivity type having a gate terminal to which the output signal is input, a drain terminal to which the second power supply potential is applied, and a source terminal which is connected to an input terminal or output terminal of the second control potential setting means.

A configuration example of the waveform shaping circuit of the present invention further comprises third control potential setting means for compensating for the second control potential, when the input signal exceeds the logical threshold value, in accordance with the first control potential.

In a configuration example of the waveform shaping circuit of the present invention, the third control potential setting means comprises an eighth transistor of the first conductivity type having a gate terminal to which the first control potential is input, a source terminal to which the second power supply potential is applied, and a drain terminal which is connected to an input terminal or output terminal of the second control potential setting means.

In a configuration example of the waveform shaping circuit of the present invention, the first capacitance element is formed by a MOS capacitor.

In a configuration example of the waveform shaping circuit of the present invention, the first capacitance element and the second capacitance element are formed by MOS capacitors.

In a configuration example of the waveform shaping circuit of the present invention, the first conductivity type is a P-channel type, the second conductivity type is an N-channel type, the first power supply potential is a ground potential, and the second power supply potential is higher than the first power supply potential.

In a configuration example of the waveform shaping circuit of the present invention, the first conductivity type is an N-channel type, the second conductivity type is a P-channel type, the first power supply potential is higher than a ground potential, and the second power supply potential is the ground potential.

BRIEF DESCRIPTION OF DRAWINGS

FIG. 16 is a block diagram showing the configuration of a waveform shaping circuit of the ninth embodiment of the present invention;

BEST MODE FOR CARRYING OUT THE INVENTION

[First Embodiment]

Figure 1:
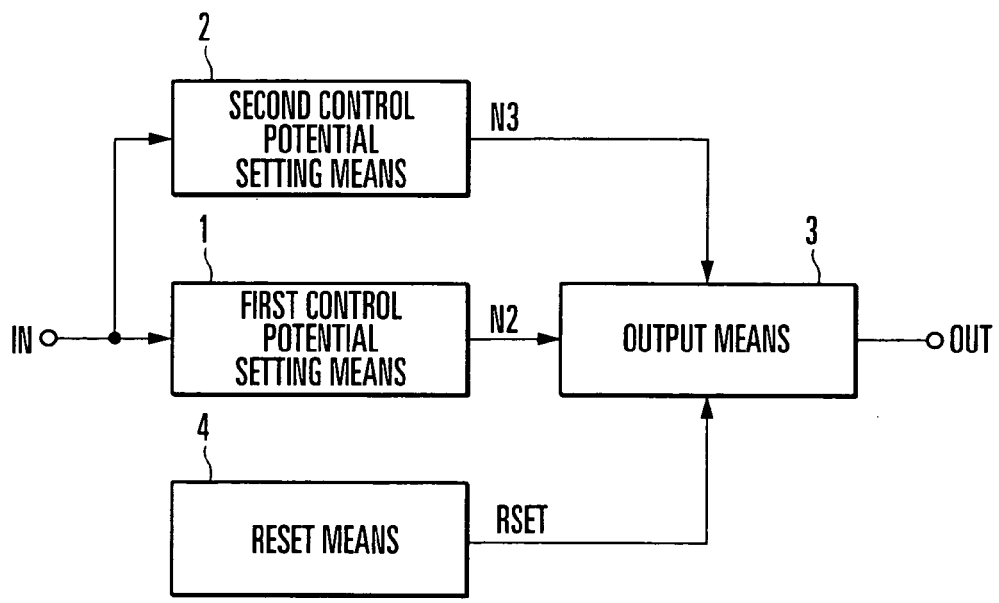
FIG. 1 is a block diagram showing the principle of a waveform shaping circuit of the first embodiment of the present invention.
Figure 18A:
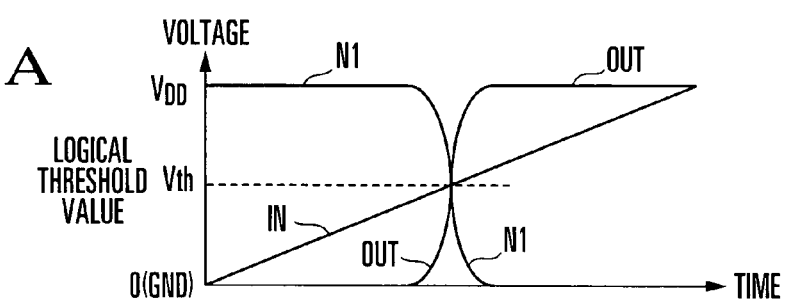
FIGS. 18A and 18B are a voltage waveform chart and a through current waveform chart, respectively, showing the operation of the waveform shaping circuit shown in FIG. 17.
Figure 18B:
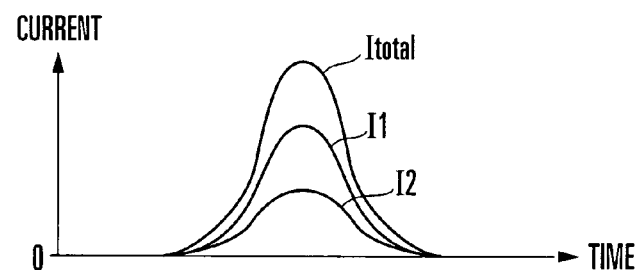

FIG. 1 is a block diagram showing the principle of a waveform shaping circuit of the first embodiment of the present invention. In this embodiment, of a through current Itotal shown in FIG. 18B, a through current I1 flowing through an output means reduces to zero. This waveform shaping circuit shown in FIG. 1 comprises a first control potential setting means 1 for generating a first control potential N2, a second control potential setting means 2 for generating a second control potential N3 which changes in the same direction as an input signal IN in accordance with a change in input signal IN, an output means 3 which includes a first transistor (not shown) having a first conductivity type and a second transistor (not shown) having a second conductivity type, and generates an output signal OUT having a predetermined potential on the basis of the first control potential N2, the second control potential N3, and a reset signal RSET, and a reset means 4 for generating the reset signal RSET, and turning off the second transistor while the waveform shaping circuit is in operation. The first control potential setting means 1 generates the first control potential N2 which reverses the magnitude relationship with the second control potential N3, when the input signal reaches the vicinity of a logical threshold value.

Figure 17A:
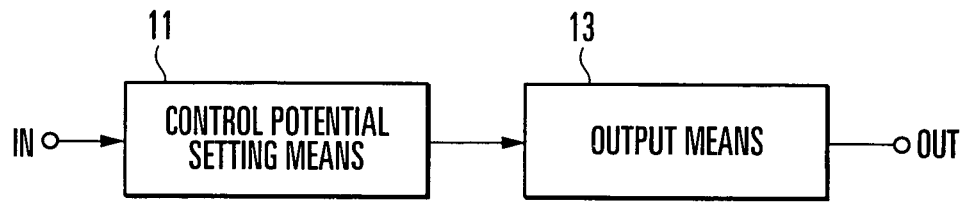
FIGS. 17A and 17B are a block diagram and a circuit diagram, respectively, showing the configuration of a conventional waveform shaping circuit.
Figure 17B:
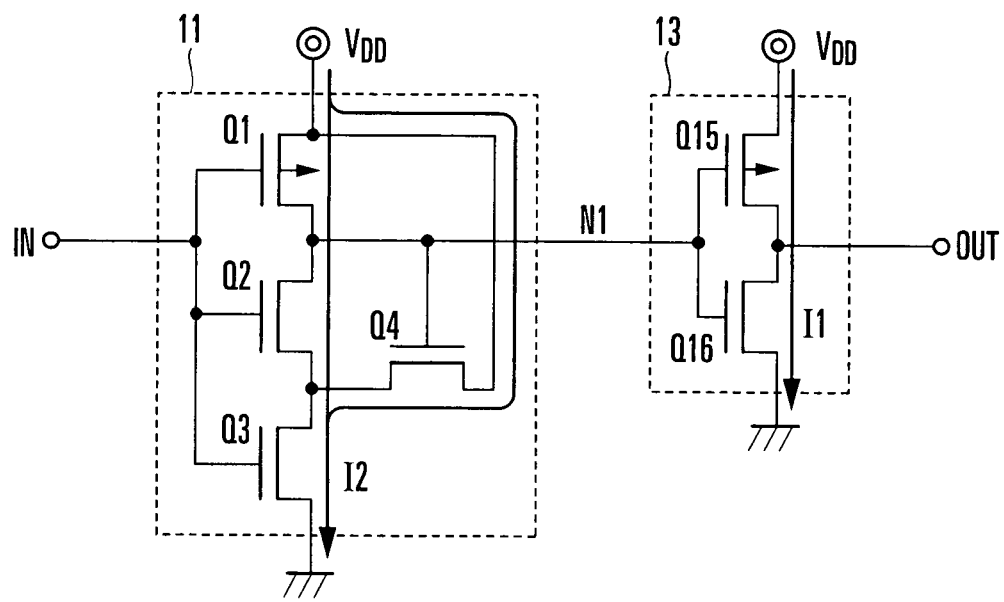

The differences from the waveform shaping circuit shown in FIGS. 17A and 17B are that the second control potential setting means 2 and reset means 4 are formed, the through current I1 is reduced to zero by shutting off the through current flowing through the second transistor of the output means 3 by the reset means 4, and the logical threshold value of the waveform shaping circuit is controlled by controlling the conduction state of the first transistor of the output means 3 by using the two control potentials N2 and N3 of the first control potential setting means 1 and second control potential setting means 2, respectively.

Figure 2:
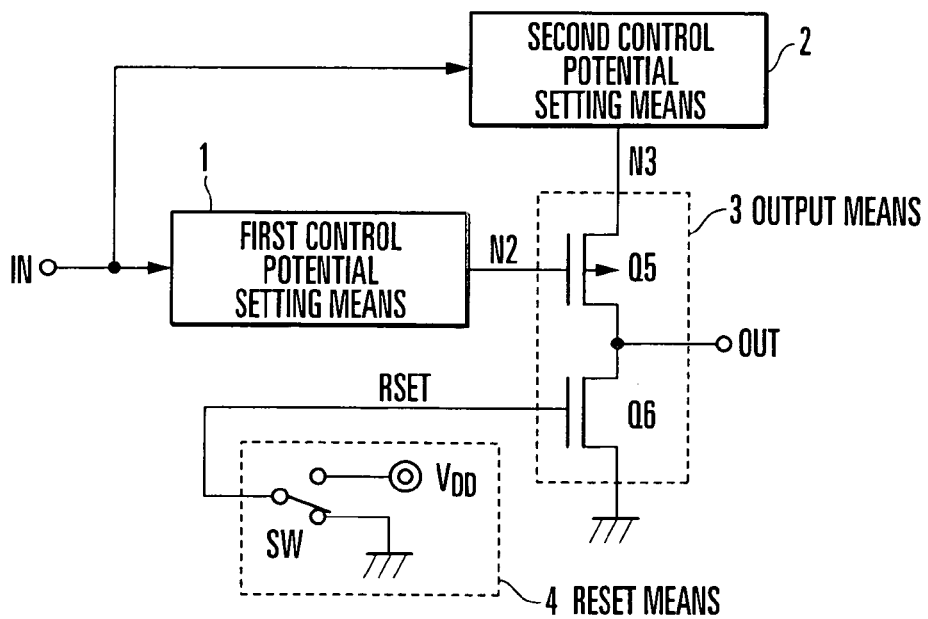
FIG. 2 is a block diagram showing the configuration of the waveform shaping circuit of the first embodiment of the present invention.

FIG. 2 is a block diagram showing the configuration of the waveform shaping circuit of the first embodiment of the present invention. The output means 3 is made up of a P-channel MOS transistor Q5 as a first transistor having a gate terminal connected to the output of the first control potential setting means 1, a source terminal connected to the output of the second control potential setting means 2, and a drain terminal connected to the output terminal of the waveform shaping circuit, and an N-channel MOS transistor Q6 as a second transistor having a gate terminal connected to the output of the reset means 4, a source terminal to which a ground potential GND as a first power supply potential is applied, and a drain terminal connected to the output terminal of the waveform shaping circuit.

The first control potential setting means 1 can have, e.g., the same arrangement as the control potential setting means 11 shown in FIG. 17B.

The reset means 4 has a switch SW which selectively outputs a power supply potential $V_{DD}$ as a second power supply potential or the ground potential GND as the first power supply potential.

In this embodiment, a through current flowing through the N-channel MOS transistor Q6 is shut off by the reset signal RSET output from the reset means 4. If the input signal IN exceeds a logical threshold value Vth, the output signal OUT at High level can be output by turning on the P-channel MOS transistor Q5 by the first control potential setting means 1 and second control potential setting means 2.

Figure 3A:
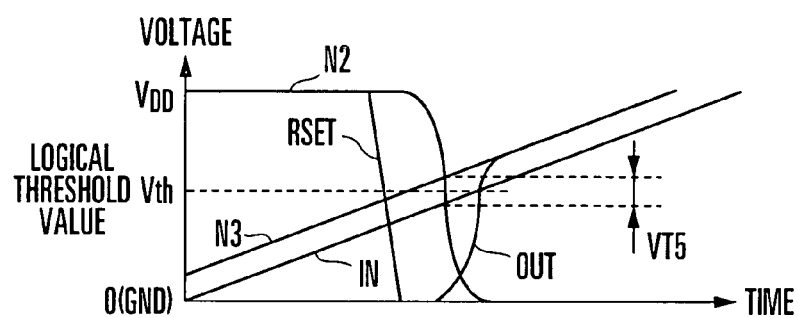
FIGS. 3A and 3B are a voltage waveform chart and a through current waveform chart, respectively, showing the operation of the waveform shaping circuit shown in FIG. 2.

The operation of the waveform shaping circuit shown in FIG. 2 will be explained below. FIG. 3A is a voltage waveform chart showing the operation of the waveform shaping circuit shown in FIG. 2. First, the reset means 4 sets the reset signal RSET at High before the waveform shaping circuit operates (when there is no signal input or when the input signal IN is fixed to the ground potential GND). Since the N-channel MOS transistor Q6 is turned on, the output signal OUT is set at Low. In this state, the first control potential setting means 1 sets the first control potential N2 at High, so the transistor Q5 is cut off.

When the waveform shaping circuit is operated, the reset means 4 sets the reset signal RSET at Low. As a consequence, the transistor Q6 is cut off, so no through current I1 flows from the power supply potential $V_{DD}$ via the transistors Q5 and Q6 of the output means 3 even if the transistor Q5 is turned on while the waveform shaping circuit is in operation. Note that the reset means 4 need only set the reset signal RSET such that when the input signal IN changes from Low to High, the transistor Q6 is turned off before the transistor Q5 is turned on.

When the input signal IN gradually increases, the first control potential N2 (the gate potential of the transistor Q5) output from the first control potential setting means 1 gradually decreases. On the other hand, the second control potential N3 (the source potential of the transistor Q5) output from the second control potential setting means 2 gradually rises. When the magnitude relationship between the first control potential N2 and second control potential N3 reverses and the gate-to-source potential of the transistor Q5 exceeds a threshold voltage VT5 of the transistor Q5, the transistor Q5 is turned on and outputs the output signal OUT at the source potential (the potential of the input signal IN) to the output terminal of the waveform shaping circuit. In this state, the potential of the input signal IN is the logical threshold value Vth. After the transistor Q5 is turned on, the output signal OUT rises at the same potential as the input signal IN.

Figure 3B:
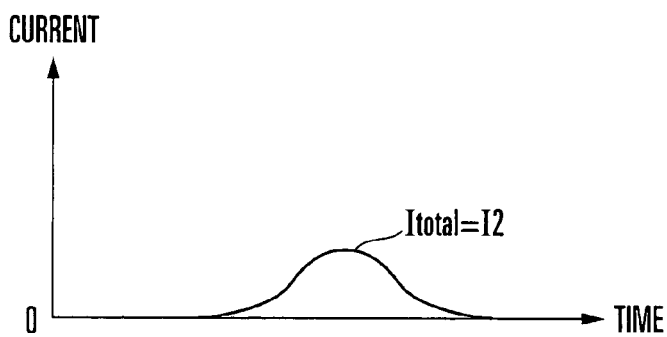

FIG. 3B is a through current waveform chart of the waveform shaping circuit of this embodiment. As described above, the reset means 4 cuts off the transistor Q6 when the waveform shaping circuit operates. Accordingly, the through current I1 flowing from the power supply potential $V_{DD}$ via the transistor Q6 of the output means 3 can be reduced to zero. As a consequence, a through current I2 flowing through the first control potential setting means 1 is the only component of the through current Itotal (Itotal=I2).

In this embodiment as described above, the through current I1 can be eliminated by the dynamic operation. Accordingly, when the waveform shaping circuit of this embodiment is applied to an application which uses a number of waveform shaping circuits, it is possible to effectively reduce the through current of each waveform shaping circuit, and thereby greatly reduce the power consumption of the whole. This effect is large because it is possible to alleviate the limitations on the current capacity of the power supply device, and eliminate the limitations imposed by the power consumption on the number of waveform shaping circuits. Note that by controlling the gate terminal and source terminal of the transistor Q5 of the output means 3 by using the first control potential setting means 1 and second control potential setting means 2, it is possible to reduce the through current by the dynamic operation, and at the same time control the logical threshold value when the transistor Q5 is turned on, thereby setting the logical threshold value Vth of the waveform shaping circuit to an appropriate value.

To simplify the explanation, this embodiment shows a circuit configuration designed by taking account of a case in which the input signal IN changes from Low (the ground potential GND) to High (the power supply potential $V_{DD}$). If the input signal IN changes from High to Low, it is only necessary, in FIG. 2, to replace the P-channel MOS transistor Q5 with an N-channel MOS transistor, and the N-channel MOS transistor Q6 with a P-channel MOS transistor, and to set the first power supply potential at the power supply potential $V_{DD}$, the second power supply potential at the ground potential GND, and the reset signal RSET at Low before the waveform shaping circuit operates, and at High while the waveform shaping circuit is in operation.

In this embodiment, no details of the arrangements of the first control potential setting means 1 and second control potential setting means 2 are clearly shown. However, the second control potential setting means 2 can take any arbitrary arrangement, provided that it generates the second control potential N3 which changes in the same direction as the input signal IN. Likewise, the first control potential setting means 1 can take any arbitrary arrangement, provided that it generates the first control potential N2 which reverses the magnitude relationship with the second control potential N3 when the input signal IN reaches the vicinity of the logical threshold value Vth.

[Second Embodiment]

Figure 4:
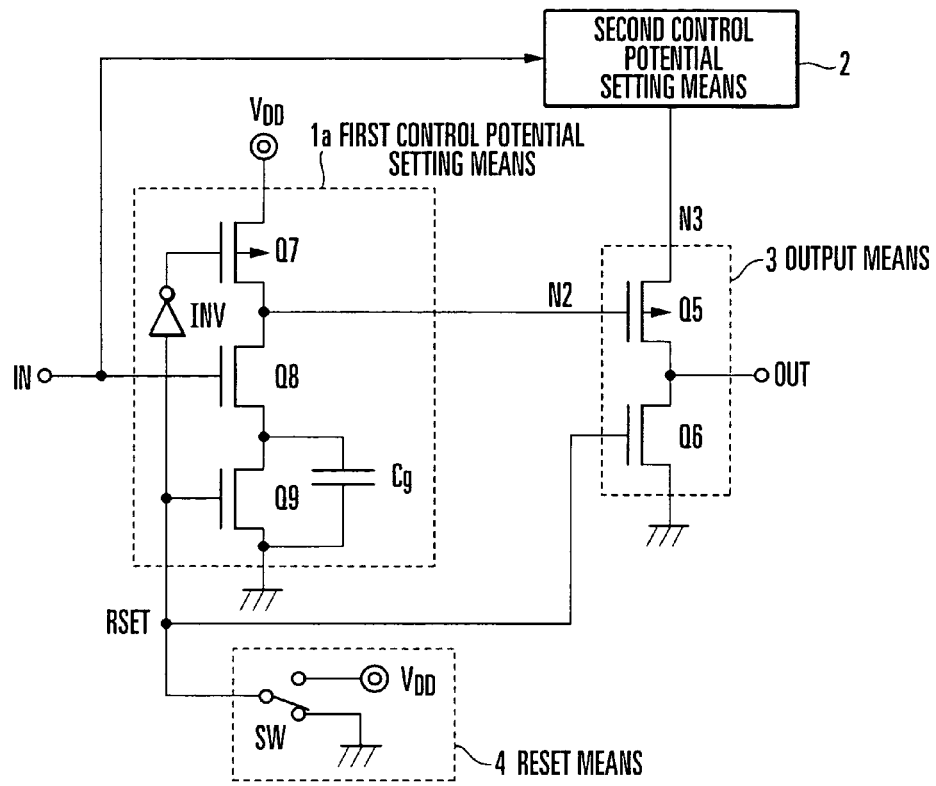
FIG. 4 is a block diagram showing the configuration of a waveform shaping circuit of the second embodiment of the present invention.

The second embodiment of the present invention will be described below. FIG. 4 is a block diagram showing the configuration of a waveform shaping circuit of the second embodiment of the present invention. In this embodiment, a through current I1 flowing through an output means 3 reduces to zero as in the first embodiment, and a through current I2 flowing through a first control potential setting means 1a also reduces to zero. The relationship between an input signal IN, first control potential N2, and second control potential N3 is the same as explained in the first embodiment.

The first control potential setting means 1a comprises a P-channel MOS transistor Q7 as a third transistor having a source terminal to which a second power supply potential $V_{DD}$ is applied, and a drain terminal which is connected as an output of the first control potential setting means 1a to the gate terminal of a transistor Q5, an N-channel MOS transistor Q8 as a fourth transistor having a gate terminal to which the input signal IN is input, and a drain terminal which is connected as an output of the first control potential setting means 1a to the gate terminal of the transistor Q5, an N-channel MOS transistor Q9 as a fifth transistor having a gate terminal to which a reset signal RSET is input, a source terminal to which a ground potential GND is applied, and a drain terminal which is connected to the source terminal of the transistor Q8, an inverter gate INV having an input terminal to which the reset signal RSET is input, and an output terminal which is connected to the gate terminal of the transistor Q7, and a first capacitance element Cg having a first terminal which is connected to the source terminal of the transistor Q8 and the drain terminal of the transistor Q9, and a second terminal to which a third power supply potential is applied.

The capacitance element Cg can be realized by a MOS capacitor, MIM (Metal-Insulator-Metal) capacitor, or PIP (Poly-Insulator-Poly) capacitor. When a MOS capacitor is used as the capacitance element Cg, the third power supply potential can be a potential at which a MOSFET of the MOS capacitor is turned on. When an MIM capacitor or PIP capacitor is used as the capacitance element Cg, the third power supply potential can be an arbitrary potential. In this embodiment, the third power supply potential is the ground potential GND.

Figure 5A:
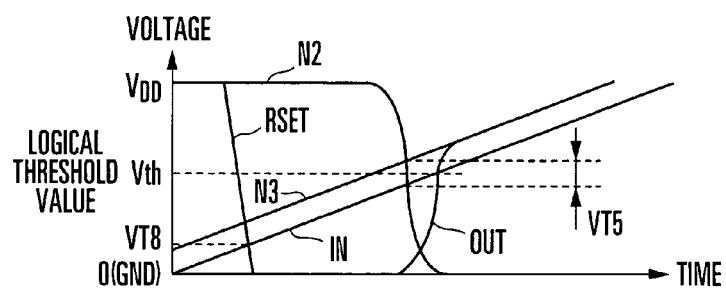
FIGS. 5A and 5B are a voltage waveform chart and a through current waveform chart, respectively, showing the operation of the waveform shaping circuit shown in FIG. 4.

The operation of the waveform shaping circuit shown in FIG. 4 will be described below. FIG. 5A is a voltage waveform chart showing the operation of the waveform shaping circuit shown in FIG. 4. First, before the waveform shaping circuit operates (when there is no signal input, or when the input signal IN is fixed to the ground potential GND), a reset means 4 sets the reset signal RSET at High. Since this turns on an N-channel MOS transistor Q6, an output signal OUT is set at Low. Also, since the reset signal RSET is set at High, the P-channel transistor Q7 and N-channel transistor Q9 are turned on, so the capacitance element Cg is discharged to the ground potential GND. As a consequence, the first control potential N2 is set at High, and the transistor Q5 is cut off.

When the waveform shaping circuit operates, the reset means 4 sets the reset signal RSET at Low. Since this cuts off the transistor Q6, no through current I1 flows from the power supply potential $V_{DD}$ via the transistors Q5 and Q6 of the output means 3, even if the transistor Q5 is turned on while the waveform shaping circuit is in operation. Similarly, the transistors Q7 and Q9 are cut off because the reset signal RSET is set at Low, so no through current I2 flows from the power supply potential $V_{DD}$ via the transistors Q7, Q8, and Q9 of the first control potential setting means 1a, even if the transistor Q8 is turned on while the waveform shaping circuit is in operation. Note that the reset means 4 need only set the reset signal RSET such that when the input signal IN changes from Low to High, the transistor Q6 is turned off before the transistor Q5 is turned on, and the transistors Q7 and Q9 are turned off before the transistor Q8 is turned on.

When the input signal IN gradually increases and exceeds a threshold voltage VT8 of the transistor Q8, the transistor Q8 is turned on, so the drain terminal of the transistor Q8 is connected to the capacitance element Cg. In this state, the transistors Q7 and Q9 are already cut off. Since the capacitance element Cg is connected, therefore, electric charge charged in the parasitic capacitance of the gate terminal of the transistor Q5 starts moving to the capacitance element Cg, and the first control potential N2 (the gate potential of the transistor Q5) output from the first control potential setting means 1a gradually lowers. On the other hand, the second control potential N3 (the source potential of the transistor Q5) output from the second control potential setting means 2 gradually rises.

As in the first embodiment, when the magnitude relationship between the first control potential N2 and second control potential N3 reverses and the gate-to-source voltage of the transistor Q5 exceeds a threshold voltage VT5, the transistor Q5 is turned on to output the output signal OUT at the source potential (the potential of the input signal IN) to the output terminal of the waveform shaping circuit.

Figure 5B:
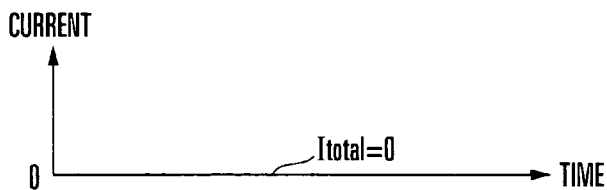

FIG. 5B is a through current waveform chart of the waveform shaping circuit of this embodiment. In this embodiment, as in the first embodiment, the through current I1 flowing from the power supply potential $V_{DD}$ via the transistor Q6 of the output means 3 can be reduced to zero.

Also, in this embodiment, the first control potential setting means 1a is made up of the capacitance element Cg, the transistors Q7 and Q9 for initializing the capacitance element Cg, and the transistor Q8 for shortcircuiting the capacitance element Cg, the capacitance element Cg is initialized by turning on the transistors Q7 and Q9 by the reset means 4 before the waveform shaping circuit operates, and the output of the first control potential setting means 1a and the capacitance element Cg are connected by turning on the transistor Q8 in accordance with a change in input signal IN while the waveform shaping circuit is in operation, thereby generating the first control potential N2. Therefore, the first control potential setting means 1a can be realized without producing any through current I1 which flows via the first control potential setting means 1a. As a result, a through current Itotal is zero as shown in FIG. 5B.

In this embodiment as described above, it is possible to discriminate the level and shape the waveform of a digital input signal or analog input signal having a slope, without producing any through current Itotal. Also, in this embodiment, the first control potential N2 can be controlled by the capacitance element Cg, so a logical threshold value Vth of the waveform shaping circuit can be set to an appropriate value by the value of the capacitance of the capacitance element Cg.

[Third Embodiment]

Figure 6:
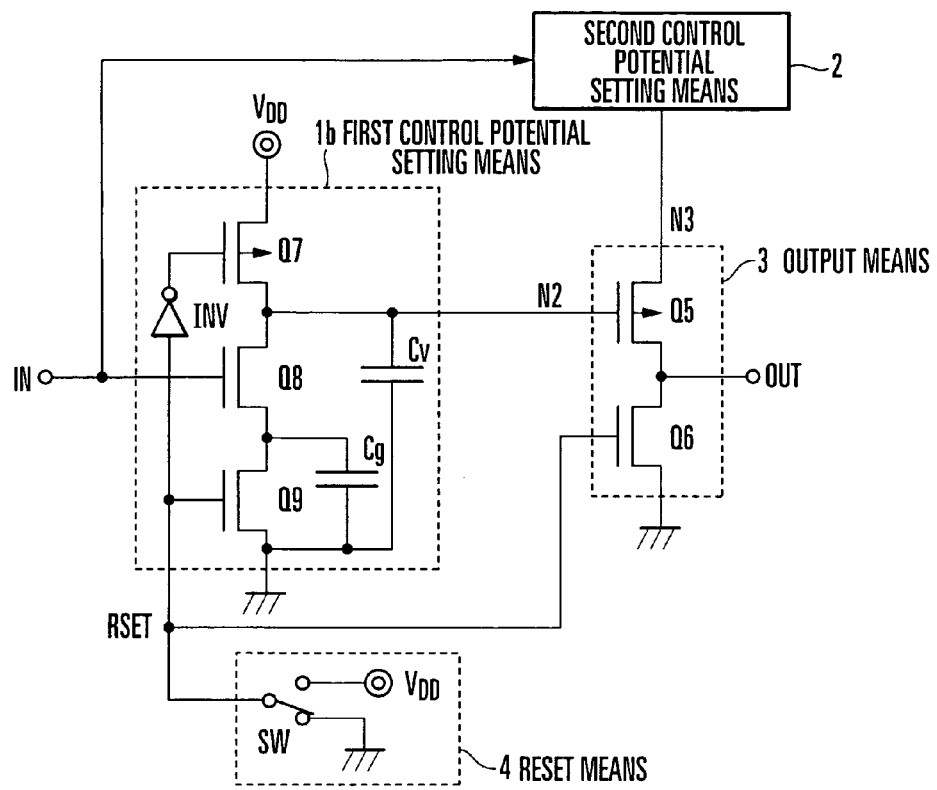
FIG. 6 is a block diagram showing the configuration of a waveform shaping circuit of the third embodiment of the present invention.

The third embodiment of the present invention will be described below. FIG. 6 is a block diagram showing the configuration of a waveform shaping circuit of the third embodiment of the present invention, in which the same reference numerals as in FIG. 4 denote the same parts.

A first control potential setting means 1b of this embodiment is obtained by adding, to the first control potential setting means 1a of the second embodiment, a second capacitance element Cv having a first terminal which is connected to the drain terminals of transistors Q7 and Q8, and a second terminal to which a fourth power supply potential is applied.

Similar to the capacitance element Cg, the capacitance element Cv can be realized by a MOS capacitor, MIM capacitor, or PIP capacitor. When a MOS capacitor is used as the capacitance element Cv, the fourth power supply potential can be a potential at which a MOSFET of the MOS capacitor is turned on. When an MIM capacitor or PIP capacitor is used as the capacitance element Cv, the fourth power supply potential can be an arbitrary potential. The fourth power supply potential can be the same as or different from the third power supply potential. In this embodiment, the fourth power supply potential is a ground potential GND.

The operation of the waveform shaping circuit of this embodiment is substantially the same as the second embodiment. The differences are that the capacitance element Cv is charged to a power supply potential $V_{DD}$ when a reset signal RSET is at High, and that when the transistor Q8 is turned on, the capacitance elements Cv and Cg are connected, and electric charge charged in the capacitance element Cv starts moving to the capacitance element Cg, so a first control potential N2 gradually lowers.

In this manner, the same effects as in the second embodiment can be obtained in this embodiment. Also, in this embodiment, the first control potential N2 can be controlled by the capacitance elements Cg and Cv. In the second embodiment, the first control potential N2 is determined by the value of the capacitance of the capacitance element Cg, so if this value of the capacitance element Cg varies due to the process, the logical threshold value Vth of the waveform shaping circuit also varies by the influence of this variation. By contrast, in this embodiment, the first control potential N2 is determined by the ratio of the capacitances of the capacitance elements Cg and Cv, so the logical threshold value Vth can be stably controlled without being influenced by the process variation. This embodiment is unaffected by the process variation because even if the individual capacitances of the capacitance elements Cg and Cv vary due to the process, the ratio of the capacitances of the capacitance elements Cg and Cv does not change.

To simplify the explanation, the second and third embodiments show circuit configurations designed by taking account of a case in which the input signal IN changes from Low to High. When the input signal IN changes from High to Low, it is only necessary, in FIGS. 4 and 6, to replace the P-channel MOS transistors Q5 and Q7 with N-channel MOS transistors, and the N-channel MOS transistors Q6, Q8, and Q9 with P-channel MOS transistors, and to set the first power supply potential at the power supply potential $V_{DD}$, the second power supply potential at the ground potential GND, and the reset signal RSET at Low before the waveform shaping circuit operates, and at High while the waveform shaping circuit is in operation.

[Fourth Embodiment]

Figure 7:
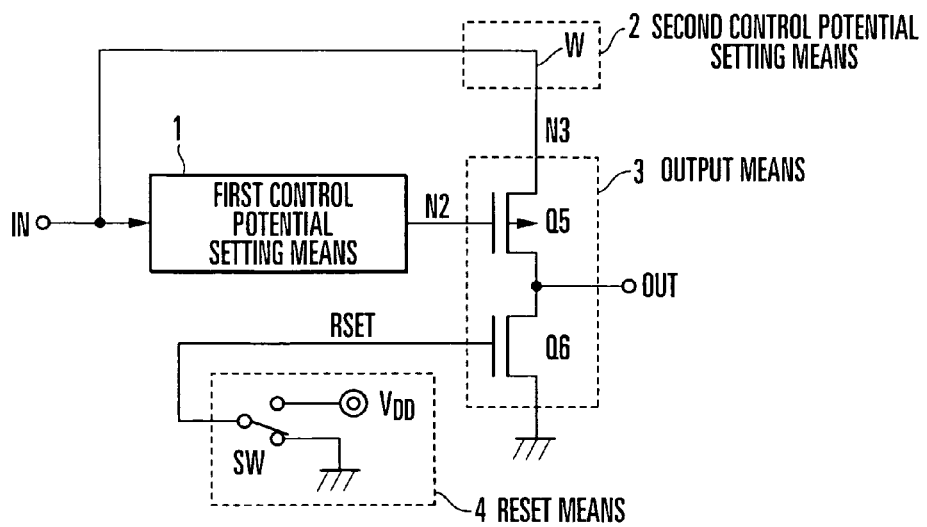
FIG. 7 is a block diagram showing the configuration of a waveform shaping circuit of the fourth embodiment of the present invention.

The fourth embodiment of the present invention will be described below. FIG. 7 is a block diagram showing the configuration of a waveform shaping circuit of the fourth embodiment of the present invention, in which the same reference numerals as in FIG. 2 denote the same parts. This embodiment shows an example of a second control potential setting means 2. The second control potential setting means 2 has a signal line W which shortcircuits the input terminal of the waveform shaping circuit and the source terminal of a transistor Q5. This allows an input signal IN to have the same potential as a second control potential N3.

In this embodiment, the second control potential setting means 2 can be realized without increasing the number of elements, and without producing any through current which flows via the second control potential setting means 2.

[Fifth Embodiment]

Figure 8:
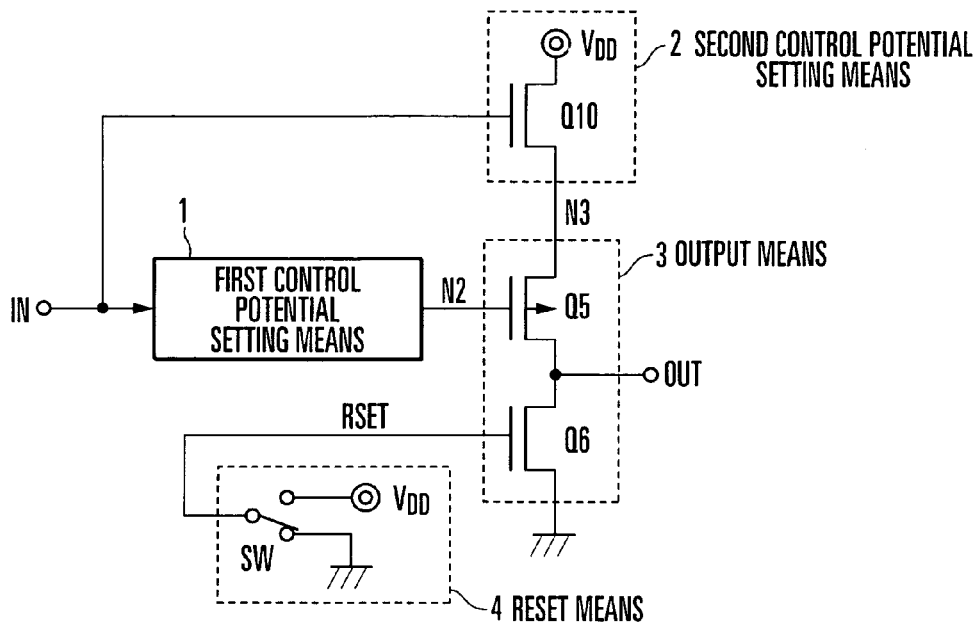
FIG. 8 is a block diagram showing the configuration of a waveform shaping circuit of the fifth embodiment of the present invention.

The fifth embodiment of the present invention will be described below. FIG. 8 is a block diagram showing the configuration of a waveform shaping circuit of the fifth embodiment of the present invention, in which the same reference numerals as in FIG. 2 denote the same parts. This embodiment shows another example of a second control potential setting means 2.

The second control potential setting means 2 has an N-channel MOS transistor Q10 as a sixth transistor having a gate terminal to which an input signal IN is applied, a drain terminal to which a power supply potential $V_{DD}$ is applied, and a source terminal which is connected to the source terminal of a transistor Q5. A second control potential N3 output from the source terminal of the transistor Q10 changes in the same direction as the input signal IN in accordance with a change in input signal IN as in the first embodiment, but the magnitude of the second control potential N3 is lower than the potential of the input signal IN by the amount of threshold voltage of the transistor Q10. The rest of the operation is the same as in the first embodiment, so a through current can be reduced to zero as in the first embodiment.

In the fourth embodiment, the output impedance of the waveform shaping circuit is affected by the input of the waveform shaping circuit. In this embodiment, however, the output impedance can be reduced by the source follower operation of the transistor Q10.

Note that in the fourth or fifth embodiment, the second control potential setting means 2 shown in FIG. 7 or 8 is applied to the first embodiment. However, the second control potential setting means 2 shown in FIG. 7 or 8 is also applicable to the second or third embodiment. When the second control potential setting means 2 shown in FIG. 7 or 8 is applied to the second or third embodiment, a through current I2 flowing through a first control potential setting means 1a can also be reduced to zero, so the power consumption can be further reduced.

Also, to simplify the explanation, the fourth and fifth embodiments show circuit configurations designed by taking account of a case in which the input signal IN changes from Low to High. When the input signal IN changes from High to Low, it is only necessary, in FIGS. 7 and 8, to replace the P-channel MOS transistor Q5 with an N-channel MOS transistor, and the N-channel MOS transistors Q6 and Q10 with P-channel MOS transistors, and to set the first power supply potential at the power supply potential $V_{DD}$, the second power supply potential at a ground potential GND, and a reset signal RSET at Low before the waveform shaping circuit operates, and at High while the waveform shaping circuit is in operation.

[Sixth Embodiment]

Figure 9:
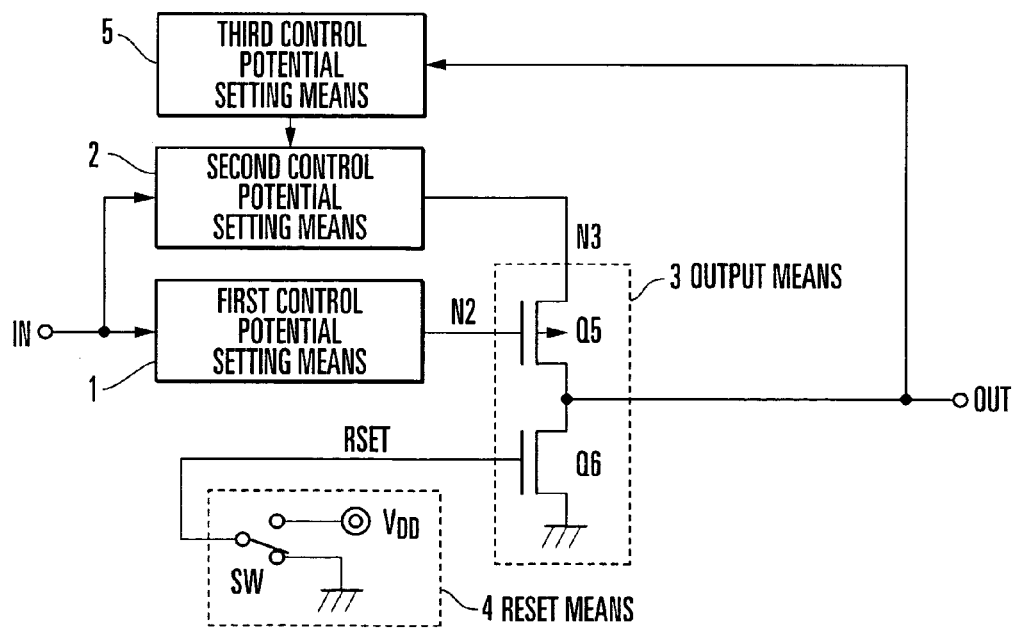
FIG. 9 is a block diagram showing the principle of a waveform shaping circuit of the sixth embodiment of the present invention.

The sixth embodiment of the present invention will be described below. FIG. 9 is a block diagram showing the principle of a waveform shaping circuit of the sixth embodiment of the present invention, in which the same reference numerals as in FIG. 2 denote the same parts. A first control potential setting means 1, second control potential setting means 2, output means 3, and reset means 4 are the same as in the first embodiment. The difference of this embodiment from the first embodiment is that this embodiment has a third control potential setting means 5 for compensating for a second control potential N3 of the second control potential setting means 2 in accordance with the potential of an output signal OUT.

The use of the third control potential setting means 5 makes it possible to feed the potential of the output signal OUT back to the second control potential setting means 2 via the third control potential setting means 5, and makes the change in output signal OUT sharp when an input signal IN exceeds a logical threshold value Vth.

Figure 10:
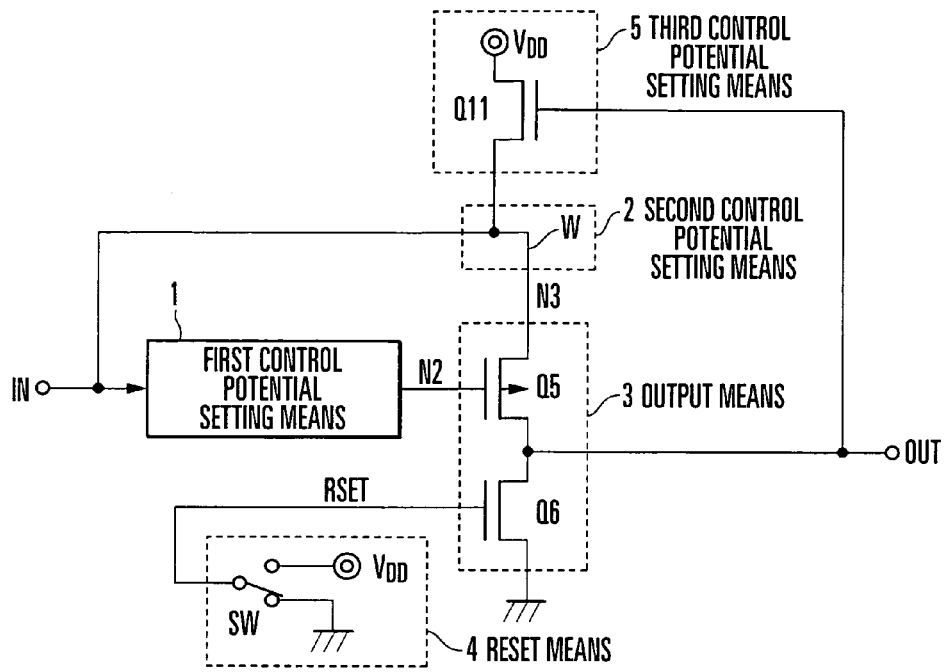
FIG. 10 is a block diagram showing an example of implementation of the waveform shaping circuit shown in FIG. 9.

FIG. 10 shows an example of implementation of this embodiment. The third control potential setting means 5 has an N-channel MOS transistor Q11 as a seventh transistor having a gate terminal connected to the output terminal of the waveform shaping circuit, a drain terminal to which a power supply potential $V_{DD}$ is applied, and a source terminal connected to the input terminal or output terminal of the second control potential setting means 2.

Figure 11A:
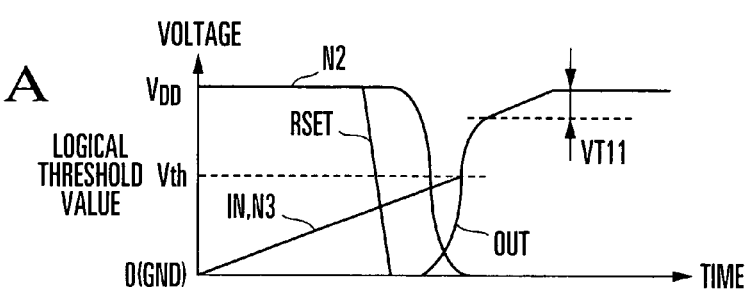
FIGS. 11A and 11B are a voltage waveform chart and a through current waveform chart, respectively, showing the operation of the waveform shaping circuit shown in FIG. 10.

The operation of the waveform shaping circuit shown in FIG. 10 will be explained below. FIG. 11A is a voltage waveform chart showing the operation of the waveform shaping circuit. The operation before the input signal IN exceeds the logical threshold value Vth is the same as in the first embodiment. As described in the first embodiment, when the input signal IN exceeds the logical threshold value Vth, a transistor Q5 is turned on, and the output signal OUT changes from Low to High, so the transistor Q11 is turned on.

Accordingly, the input signal IN abruptly rises toward the power supply potential $V_{DD}$, so the second control potential N3 which is the same as the power supply potential $V_{DD}$ also abruptly rises. Consequently, as shown in FIG. 11A, the output signal OUT abruptly rises. When the input signal IN rises to a level lower than the power supply potential $V_{DD}$ by the amount of threshold voltage VT11 of the transistor Q11, the transistor Q11 is cut off, and the potential of the input signal IN moderately rises in accordance with the original change in input signal itself.

Figure 11B:
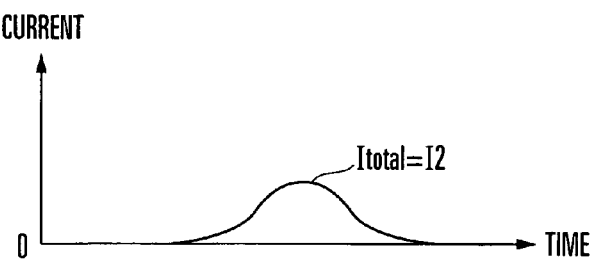

FIG. 11B is a through current waveform chart of the waveform shaping circuit of this embodiment. In this embodiment, as in the first embodiment, a through current I1 which flows from the power supply potential $V_{DD}$ via a transistor Q6 of an output means 3 can be reduced to zero.

In this embodiment as described above, the use of the third control potential setting means 5 makes it possible to compensate for the level of the output signal OUT when the input signal IN exceeds the logical threshold value Vth.

[Seventh Embodiment]

Figure 12:
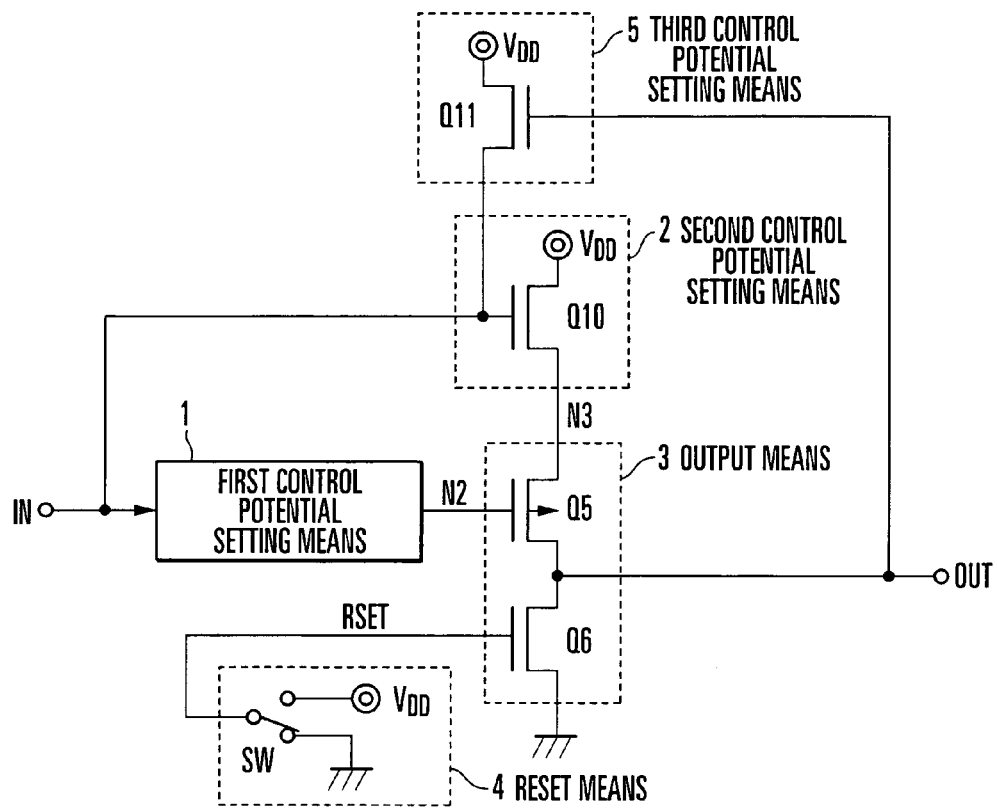
FIG. 12 is a block diagram showing the configuration of a waveform shaping circuit of the seventh embodiment of the present invention.

The seventh embodiment of the present invention will be described below. FIG. 12 is a block diagram showing the configuration of a waveform shaping circuit of the seventh embodiment of the present invention, in which the same reference numerals as in FIG. 10 denote the same parts. In the sixth embodiment, the arrangement of the fourth embodiment shown in FIG. 7 is used as the arrangement of the second control potential setting means 2. In this embodiment, the arrangement of the fifth embodiment shown in FIG. 8 is used as the arrangement of a second control potential setting means 2.

In this manner, the same effects as in the sixth embodiment can be obtained in this embodiment. As explained in the sixth embodiment, the source terminal of a transistor Q11 is connected to the input terminal (the gate terminal of a transistor Q10) or the output terminal (the source terminals of a transistor Q5 and the transistor Q10) of the second control potential setting means 2. Therefore, the source terminal of the transistor Q11 may also be connected to the source terminals of the transistors Q5 and Q10.

[Eighth Embodiment]

Figure 13:
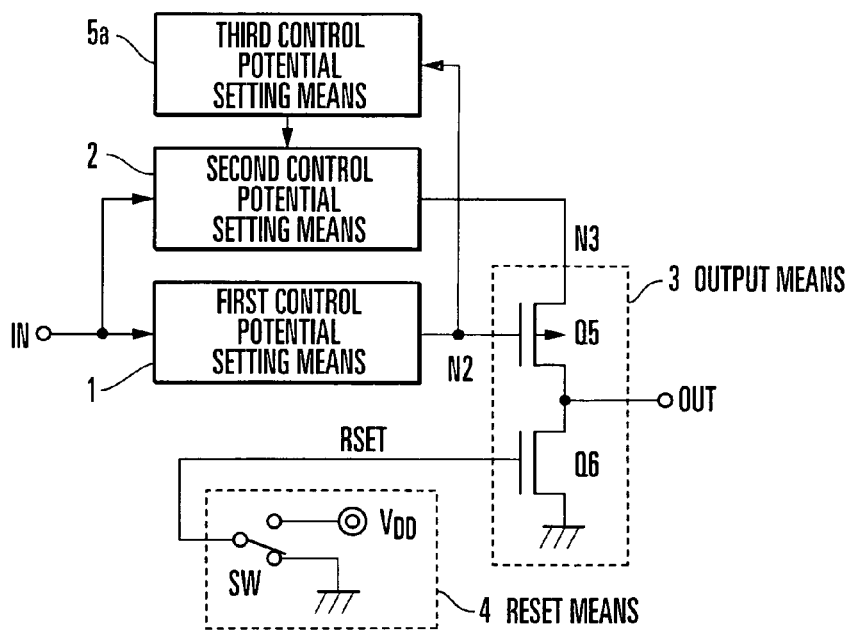
FIG. 13 is a block diagram showing the principle of a waveform shaping circuit of the eighth embodiment of the present invention.

The eighth embodiment of the present invention will be described below. FIG. 13 is a block diagram showing the principle of a waveform shaping circuit of the eighth embodiment of the present invention, in which the same reference numerals as in FIG. 2 denote the same parts. A first control potential setting means 1, second control potential setting means 2, output means 3, and reset means 4 are the same as in the first embodiment. The difference of this embodiment from the first embodiment is that this embodiment has a third control potential setting means 5a for compensating for a second control potential N3 of the second control potential setting means 2 in accordance with the potential of a first control potential N2.

The use of the third control potential setting means 5a makes it possible to feed the first control potential N2 back to the second control potential setting means 2 via the third control potential setting means 5a, and makes the change in output signal OUT sharp when an input signal IN exceeds a logical threshold value Vth.

Figure 14:
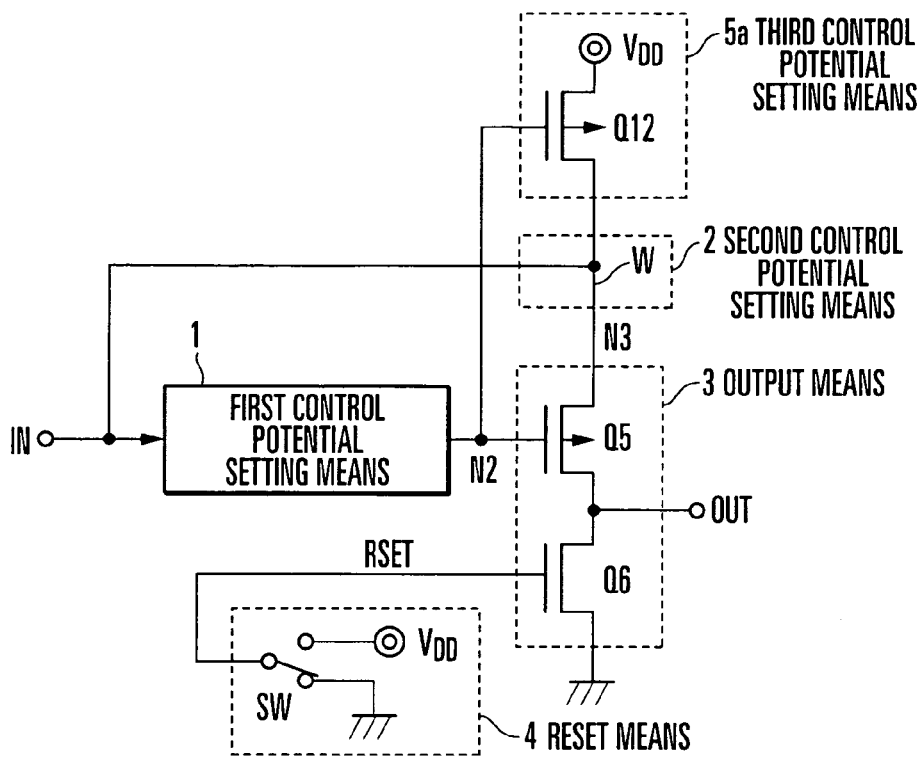
FIG. 14 is a block diagram showing an example of implementation of the waveform shaping circuit shown in FIG. 13.

FIG. 14 shows an example of implementation of this embodiment. The third control potential setting means 5a has an P-channel MOS transistor Q12 as an eighth transistor having a gate terminal to which the first control potential N2 is input, a source terminal to which a power supply potential $V_{DD}$ is applied, and a drain terminal connected to the input terminal or output terminal of the second control potential setting means 2.

Figure 15A:
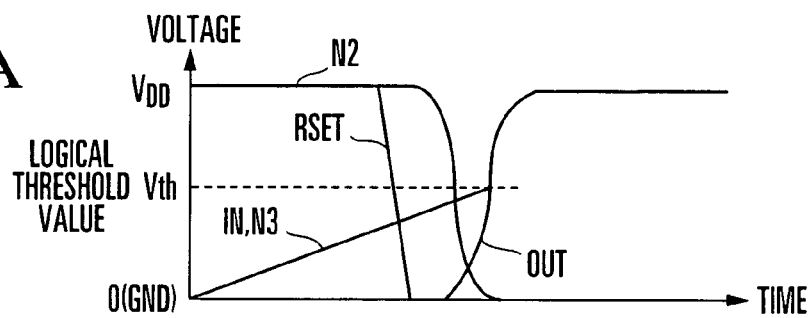
FIGS. 15A and 15B are a voltage waveform chart and a through current waveform chart, respectively, showing the operation of the waveform shaping circuit shown in FIG. 14.

The operation of the waveform shaping circuit shown in FIG. 14 will be explained below. FIG. 15A is a voltage waveform chart showing the operation of the waveform shaping circuit. The operation before the input signal IN exceeds the logical threshold value Vth is the same as in the first embodiment. As described in the first embodiment, the first control potential N2 gradually lowers in accordance with the rise of the input signal IN, and, when the input signal IN exceeds the logical threshold value Vth and the magnitude relationship between the first control potential N2 and second control potential N3 reverses, the transistor Q12 is turned on.

Accordingly, the input signal IN abruptly rises toward the power supply potential $V_{DD}$, so the second control potential N3 which is the same as the power supply potential $V_{DD}$ also abruptly rises. Consequently, as shown in FIG. 15A, the output signal OUT abruptly rises. In the sixth and seventh embodiments, when the input signal IN exceeds the logical threshold value Vth, the transistor Q11 is once turned on and then cut off again, so the output signal OUT moderates its change before reaching the power supply potential $V_{DD}$. In this embodiment, however, the transistor Q12 is not cut off again while the input signal IN exceeds the logical threshold value Vth. This can make the change in output signal OUT sharper than in the sixth and seventh embodiments.

Figure 15B:
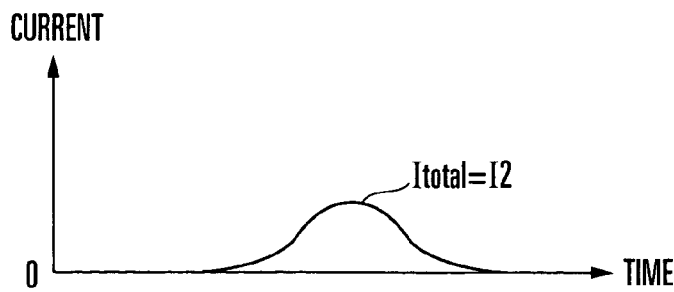

FIG. 15B is a through current waveform chart of the waveform shaping circuit of this embodiment. In this embodiment, as in the first embodiment, a through current I1 which flows from the power supply potential $V_{DD}$ via a transistor Q6 of an output means 3 can be reduced to zero.

In this embodiment as described above, the use of the third control potential setting means 5a makes it possible to compensate for the level of the output signal OUT when the input signal IN exceeds the logical threshold value Vth.

[Ninth Embodiment]

The ninth embodiment of the present invention will be described below. FIG. 16 is a block diagram showing the configuration of a waveform shaping circuit of the ninth embodiment of the present invention, in which the same reference numerals as in FIG. 14 denote the same parts. In the eighth embodiment, the arrangement of the fourth embodiment shown in FIG. 7 is used as the arrangement of the second control potential setting means 2. In this embodiment, the arrangement of the fifth embodiment shown in FIG. 8 is used as the arrangement of a second control potential setting means 2. In this manner, the same effects as in the eighth embodiment can be obtained in this embodiment.

As explained in the eighth embodiment, the drain terminal of a transistor Q12 is connected to the input terminal or output terminal of the second control potential setting means 2, so the drain terminal of the transistor Q12 may also be connected to the source terminals of transistors Q5 and Q10.

In the sixth to ninth embodiments, the third control potential setting means 5 shown in FIG. 10 or 12 or the third control potential setting means 5a shown in FIG. 14 or 16 is applied to the first embodiment. However, the third control potential setting means 5 or 5a is also applicable to the second or third embodiment.

Also, to simplify the explanation, the sixth to ninth embodiments show circuit configurations designed by taking account of a case in which the input signal IN changes from Low to High. When the input signal IN changes from High to Low, it is only necessary, in FIGS. 10, 12, 14 and 16, to replace the P-channel MOS transistors Q5 and Q12 with N-channel MOS transistors, and the N-channel MOS transistors Q6, Q10, and Q11 with P-channel MOS transistors, and to set the first power supply potential at the power supply potential $V_{DD}$, the second power supply potential at the ground potential GND, and the reset signal RSET at Low before the waveform shaping circuit operates, and at High while the waveform shaping circuit is in operation.

In the first to ninth embodiments, the output signal OUT having the same polarity as the input signal IN is output. However, when an inverter is added after the output means 3, the waveform shaping circuit, of course, outputs an inverted signal of the input signal IN.

Furthermore, in the first to ninth embodiment, the reset means 4 is controlled by a control means (not shown). This control means controls the reset means 4 to output the reset signal RSET under the above-mentioned conditions, in accordance with the timing at which the input signal IN is input from a gate circuit (not shown) or the like to the waveform shaping circuit. The control means can also control the reset means 4 to output the reset signal RSET under the above-mentioned conditions, by observing the level of the input signal IN (or observing the levels of the first control potential N2 and second control potential N3 in addition to the input signal IN).

As described above, the waveform shaping circuit of the present invention is useful in an apparatus required to reduce the power consumption, and is suitably incorporated into a battery-driven portable terminal apparatus.

What is claimed is:

1. A waveform shaping circuit which, on the basis of a logical threshold value, discriminates a level and shapes a waveform of an input signal which changes between a first power supply potential and second power supply potential, characterized by comprising:
    first control potential setting means for generating a first control potential;
    second control potential setting means for generating a second control potential which changes in the same direction as the input signal in accordance with a change in input signal;
    output means which comprises a first transistor of a first conductivity type having a gate terminal to which the first control potential is applied, and a source terminal to which the second control potential is applied, and a second transistor of a second conductivity type having a source terminal to which the first power supply potential is applied, and a drain terminal to which the drain terminal of said first transistor is connected, and which outputs an output signal having a potential of the drain terminals of said first and second transistors; and
    reset means for applying a reset signal for turning off said second transistor to the gate terminal of said second transistor,
    wherein said first control potential setting means generates the first control potential which reverses a magnitude relationship with the second control potential when the input signal reaches a vicinity of the logical threshold value, and
    said output means generates an output signal having a predetermined potential on the basis of the first control potential, second control potential, and reset signal.

2. A waveform shaping circuit according to claim 1, characterized in that
    said first control potential setting means comprises:
    a third transistor of the first conductivity type having a source terminal to which the second power supply potential is applied, and a drain terminal which is connected as an output of said first control potential setting means to the gate terminal of said first transistor;
    a fourth transistor of the second conductivity type having a gate terminal to which the input signal is input, and a drain terminal which is connected as an output of the first control potential setting means to the gate terminal of said first transistor;
    a fifth transistor of the second conductivity type having a gate terminal to which the reset signal is input, a source terminal to which the first power supply potential is applied, and a drain terminal which is connected to the source terminal of said fourth transistor;
    an inverter gate having an input terminal to which the reset signal is input, and an output terminal which is connected to the gate terminal of said third transistor; and
    a first capacitance element having a first terminal which is connected to the source terminal of said fourth transistor and the drain terminal of said fifth transistor, and a second terminal to which the first power supply potential is applied, and
    said reset means outputs the reset signal which turns on said third transistor and said fifth transistor before the waveform shaping circuit operates, and outputs the reset signal which turns off said third transistor and said fifth transistor while the waveform shaping circuit is in operation.

3. A waveform shaping circuit according to claim 2, characterized in that said first control potential setting means further comprises a second capacitance element having a first terminal which is connected to the drain terminals of said third transistor and said fourth transistor, and a second terminal to which the first power supply potential is applied.

4. A waveform shaping circuit according to claim 3, characterized in that said reset means outputs the reset signal such that said second transistor is turned off before said first transistor is turned on, and said third transistor and said fifth transistor are turned off before said fourth transistor is turned on.

5. A waveform shaping circuit according to claim 3, characterized in that said second control potential setting means comprises a signal line which shortcircuits an input terminal of the waveform shaping circuit and the source terminal of said first transistor, and sets the second control potential at the same potential as the input signal.

6. A waveform shaping circuit according to claim 3, characterized in that said second control potential setting means comprises a sixth transistor of the second conductivity type having a gate terminal to which the input signal is applied, a drain terminal to which the second power supply potential is applied, and a source terminal which is connected to the source terminal of said first transistor, and outputs a potential at the source terminal of said sixth transistor as the second control potential.

7. A waveform shaping circuit according to claim 3, characterized by further comprising third control potential setting means for compensating for the second control potential, when the input signal exceeds the logical threshold value, in accordance with the potential at the output signal.

8. A waveform shaping circuit according to claim 7, characterized in that said third control potential setting means comprises a seventh transistor of the second conductivity type having a gate terminal to which the output signal is input, a drain terminal to which the second power supply potential is applied, and a source terminal which is connected to an input terminal or output terminal of said second control potential setting means.

9. A waveform shaping circuit according to claim 3, characterized by further comprising third control potential setting means for compensating for the second control potential, when the input signal exceeds the logical threshold value, in accordance with the first control potential.

10. A waveform shaping circuit according to claim 9, characterized in that said third control potential setting means comprises an eighth transistor of the first conductivity type having a gate terminal to which the first control potential is input, a source terminal to which the second power supply potential is applied, and a drain terminal which is connected to an input terminal or output terminal of said second control potential setting means.

11. A waveform shaping circuit according to claim 3, characterized in that said first capacitance element and said second capacitance element are formed by MOS capacitors.

12. A waveform shaping circuit according to claim 3, characterized in that the first conductivity type is a P-channel type, the second conductivity type is an N-channel type, the first power supply potential is a ground potential, and the second power supply potential is higher than the first power supply potential.

13. A waveform shaping circuit according to claim 3, characterized in that the first conductivity type is an N-channel type, the second conductivity type is a P-channel type, the first power supply potential is higher than a ground potential, and the second power supply potential is the ground potential.

14. A waveform shaping circuit according to claim 1, characterized in that said reset means outputs the reset signal such that said second transistor is turned off before said first transistor is turned on.

15. A waveform shaping circuit according to claim 1, characterized in that said second control potential setting means sets the second control potential at the same potential as the input signal.

16. A waveform shaping circuit according to claim 1, characterized in that said second control potential setting means comprises a sixth transistor of the second conductivity type having a gate terminal to which the input signal is applied, a drain terminal to which the second power supply potential is applied, and a source terminal which is connected to the source terminal of said first transistor, and outputs a potential at the source terminal of said sixth transistor as the second control potential.

17. A waveform shaping circuit according to claim 1, characterized by further comprising third control potential setting means for compensating for the second control potential, when the input signal exceeds the logical threshold value, in accordance with the potential at the output signal.

18. A waveform shaping circuit according to claim 17, characterized in that said third control potential setting means comprises a seventh transistor of the second conductivity type having a gate terminal to which the output signal is input, a drain terminal to which the second power supply potential is applied, and a source terminal which is connected to an input terminal or output terminal of said second control potential setting means.

19. A waveform shaping circuit according to claim 1, characterized by further comprising third control potential setting means for compensating for the second control potential, when the input signal exceeds the logical threshold value, in accordance with the first control potential.

20. A waveform shaping circuit according to claim 19, characterized in that said third control potential setting means comprises an eighth transistor of the first conductivity type having a gate terminal to which the first control potential is input, a source terminal to which the second power supply potential is applied, and a drain terminal which is connected to an input terminal or output terminal of said second control potential setting means.

21. A waveform shaping circuit according to claim 1, characterized in that the first conductivity type is a P-channel type, the second conductivity type is an N-channel type, the first power supply potential is a ground potential, and the second power supply potential is higher than the first power supply potential.

22. A waveform shaping circuit according to claim 1, characterized in that the first conductivity type is an N-channel type, the second conductivity type is a P-channel type, the first power supply potential is higher than a ground potential, and the second power supply potential is the ground potential.

23. A waveform shaping circuit according to claim 2, characterized in that said reset means outputs the reset signal such that said second transistor is turned off before said first transistor is turned on, and said third transistor and said fifth transistor are turned off before said fourth transistor is turned on.

24. A waveform shaping circuit according to claim 2, characterized in that said second control potential setting means comprises a signal line which shortcircuits an input terminal of the waveform shaping circuit and the source terminal of said first transistor, and sets the second control potential at the same potential as the input signal.

25. A waveform shaping circuit according to claim 2, characterized in that said second control potential setting means comprises a sixth transistor of the second conductivity type having a gate terminal to which the input signal is applied, a drain terminal to which the second power supply potential is applied, and a source terminal which is connected to the source terminal of said first transistor, and outputs a potential at the source terminal of said sixth transistor as the second control potential.

26. A waveform shaping circuit according to claim 2, characterized by further comprising third control potential setting means for compensating for the second control potential, when the input signal exceeds the logical threshold value, in accordance with the potential at the output signal.

27. A waveform shaping circuit according to claim 26, characterized in that said third control potential setting means comprises a seventh transistor of the second conductivity type having a gate terminal to which the output signal is input, a drain terminal to which the second power supply potential is applied, and a source terminal which is connected to an input terminal or output terminal of said second control potential setting means.

28. A waveform shaping circuit according to claim 2, characterized by further comprising third control potential setting means for compensating for the second control potential, when the input signal exceeds the logical threshold value, in accordance with the first control potential.

29. A waveform shaping circuit according to claim 28, characterized in that said third control potential setting means comprises an eighth transistor of the first conductivity type having a gate terminal to which the first control potential is input, a source terminal to which the second power supply potential is applied, and a drain terminal which is connected to an input terminal or output terminal of said second control potential setting means.

30. A waveform shaping circuit according to claim 2, characterized in that said first capacitance element is formed by a MOS capacitor.

31. A waveform shaping circuit according to claim 2, characterized in that the first conductivity type is a P-channel type, the second conductivity type is an N-channel type, the first power supply potential is a ground potential, and the second power supply potential is higher than the first power supply potential.

32. A waveform shaping circuit according to claim 2, characterized in that the first conductivity type is an N-channel type, the second conductivity type is a P-channel type, the first power supply potential is higher than a ground potential, and the second power supply potential is the ground potential.

* * * * *